United States Patent
Baldasseroni et al.

(10) Patent No.: US 10,648,079 B2
(45) Date of Patent: *May 12, 2020

(54) REDUCING BACKSIDE DEPOSITION AT WAFER EDGE

(71) Applicant: Lam Research Corporation, Fremont, CA (US)

(72) Inventors: Chloe Baldasseroni, Portland, OR (US); Andrew Duvall, Portland, OR (US); Ryan Blaquiere, Portland, OR (US); Shankar Swaminathan, Beaverton, OR (US)

(73) Assignee: Lam Research Corporation, Fremont, CA (US)

(*) Notice: Subject to any disclaimer, the term of this patent is extended or adjusted under 35 U.S.C. 154(b) by 292 days.

This patent is subject to a terminal disclaimer.

(21) Appl. No.: 14/578,126

(22) Filed: Dec. 19, 2014

(65) Prior Publication Data

US 2016/0177444 A1    Jun. 23, 2016

(51) Int. Cl.

| | |
|---|---|
| *H01L 21/687* | (2006.01) |
| *H01L 21/683* | (2006.01) |
| *C23C 16/458* | (2006.01) |
| *C23C 14/50* | (2006.01) |
| *H01J 37/32* | (2006.01) |

(52) U.S. Cl.
CPC .... *C23C 16/4585* (2013.01); *H01J 37/32623* (2013.01); *H01L 21/68735* (2013.01); *H01L 21/68785* (2013.01)

(58) Field of Classification Search
USPC .................. 118/715–733; 156/345.1–345.55
See application file for complete search history.

(56) References Cited

U.S. PATENT DOCUMENTS

| | | | | |
|---|---|---|---|---|
| 5,569,350 A | * | 10/1996 | Osada | H01L 21/6831 |
| | | | | 118/500 |
| 6,044,534 A | * | 4/2000 | Seo | H01L 21/68707 |
| | | | | 29/25.01 |
| 6,217,663 B1 | * | 4/2001 | Inokuchi | H01L 21/67167 |
| | | | | 118/500 |
| 6,225,223 B1 | | 5/2001 | Seo et al. | |
| 6,589,352 B1 | * | 7/2003 | Yudovsky | C23C 16/4585 |
| | | | | 118/500 |

(Continued)

FOREIGN PATENT DOCUMENTS

CN    102110632 A    6/2011

*Primary Examiner* — Karla A Moore
*Assistant Examiner* — Tiffany Z Nuckols
(74) *Attorney, Agent, or Firm* — Penilla IP, APC

(57) ABSTRACT

A process chamber for depositing a film on a wafer is provided, including: a pedestal having, a central top surface having a plurality of wafer supports configured to support the wafer at a support level above the central top surface, an annular surface at a step down from the central top surface; a carrier ring configured to be supported by carrier ring supports such that a bottom surface of the carrier ring is at a first vertical separation above the annular surface, the carrier ring having a step down surface defined relative to a top surface; wherein when the carrier ring is seated on the carrier ring supports, then the step down surface of the carrier ring is positioned at a process level that is at a second vertical separation from the support level over the top surface of the pedestal.

18 Claims, 11 Drawing Sheets

(56) References Cited

U.S. PATENT DOCUMENTS

| | | | |
|---|---|---|---|
| 6,676,759 B1* | 1/2004 | Takagi | H01L 21/68735 118/500 |
| 2004/0187790 A1* | 9/2004 | Bader | C23C 16/4581 118/728 |
| 2008/0141942 A1* | 6/2008 | Brown | C23C 14/564 118/723 R |
| 2009/0255901 A1* | 10/2009 | Okita | H01J 37/321 216/67 |
| 2010/0051584 A1 | 3/2010 | Okita et al. | |
| 2011/0116207 A1* | 5/2011 | Sato | H01L 21/6831 361/234 |
| 2013/0168353 A1* | 7/2013 | Okita | H01L 21/67069 216/67 |

* cited by examiner

REDUCING BACKSIDE DEPOSITION AT WAFER EDGE

FIELD OF THE INVENTION

The present embodiments relate to semiconductor wafer processing equipment tools, and more particularly, carrier rings used in chambers. The chambers being for processing and transport of wafers.

BACKGROUND

Description of the Related Art

In atomic layer deposition (ALD), a film is deposited layer by layer by successive dosing and activation steps. ALD is used to generate conformal films on high aspect ratio structures. One of the drawbacks of ALD is that film deposition on the backside of the wafer is difficult to avoid because the film can be deposited through any gap accessing the wafer backside. Backside deposition is unwanted in spacer applications as it leads to alignment/focusing issues during lithography steps that are part of the integration flow.

Film on the backside is generated by transport of precursor species to the backside during the dose step, and reaction of the precursor by radical species transported during the activation step. On a baseline process, a ring of film as thick as the frontside film at the edge and extending to greater than 5 mm inward from the edge has been observed.

It is in this context that embodiments of the inventions arise.

SUMMARY

Embodiments of the disclosure provide systems, apparatuses, and methods to reduce backside deposition during ALD processing.

In an ALD process chamber, a wafer is supported on a pedestal assembly which is also fitted with a carrier ring used for wafer indexing in the chamber. In such a configuration, two main transport paths to the backside of the wafer are available: a gap between the wafer and the carrier ring, and a gap between the carrier ring and the pedestal. Embodiments of the invention provide a novel method for reducing backside deposition at the wafer edge in low temperature ALD processes. A modified pedestal and carrier ring design is provided which limits the transport path of precursor or radical species to the backside of the wafer, thereby greatly reducing the formation of film on the backside to less than 50 angstroms at 3 mm from the edge. Embodiments of the invention reduce backside deposition at the wafer edge by using a combination of a pedestal and a carrier ring which reduce the two main gaps: wafer to carrier ring (e.g. from 14 mil to, e.g., 6.5 mil) and carrier ring to pedestal (e.g. from 6 mil to, e.g., 2 mil).

In one embodiment, a process chamber for depositing a film on a wafer is provided, comprising: a pedestal configured to receive the wafer, the pedestal having, a central top surface extending from a central axis of the pedestal to a top surface diameter, the central top surface having a plurality of wafer supports defined thereon, the wafer supports configured to support the wafer at a support level above the central top surface, an annular surface extending from the top surface diameter to an outer diameter of the annular surface, the annular surface being at a step down from the central top surface, a plurality of carrier ring supports positioned at the outer diameter of the annular surface; a carrier ring having an annular body with a bottom surface and a top surface, the bottom surface of the annular body of the carrier ring configured to be supported by the carrier ring supports such that the bottom surface of the annular body is at a first vertical separation above the annular surface, the carrier ring having an inner diameter and a step down surface is defined proximate to the inner diameter, the step down surface being relative to the top surface that extends from the step down surface to an outer diameter of the annular body; wherein when the carrier ring is seated on the carrier ring supports, then the step down surface of the carrier ring is positioned at a process level that is at a second vertical separation from the support level over the top surface of the pedestal; wherein the first vertical separation defines a lower gap between the bottom surface of the carrier ring and the annular surface, and the second vertical separation defines an upper gap between the step down surface of the carrier ring and a wafer when supported on the plurality of wafer supports on the pedestal, the upper gap being less than about 0.15 mm; wherein an edge of the wafer is configured to overhang over the top surface diameter so that the edge of the wafer overhangs and resides over the step down surface of the carrier ring when the wafer is present in the process chamber and supported on the wafer supports.

In one embodiment, the lower gap is less than about 0.15 mm.

In one embodiment, the lower gap is about 0.1 mm or less.

In one embodiment, the upper gap is about 0.1 mm or less.

In one embodiment, each carrier ring support is height adjustable to define the first vertical separation above the annular surface at which the bottom surface of the carrier ring is positioned when the carrier ring is supported by the carrier ring supports.

In one embodiment, at least one of the carrier ring supports includes one or more spacers for adjusting the height of the at least one of the carrier ring supports.

In one embodiment, the plurality of carrier ring supports defines at least three carrier ring supports symmetrically positioned at the outer diameter of the annular surface.

In one embodiment, the lower gap and the upper gap limit access by process gases to a backside of the wafer during a deposition process, the lower gap and upper gap limiting deposition on the backside of the wafer at an edge region of the wafer to less than about 20% of deposition on a front side of the wafer at the edge region, the edge region being defined at approximately 3 mm from the edge of the wafer.

In one embodiment, the deposition process is an atomic layer deposition (ALD) process.

In one embodiment, the carrier ring is configured to support the wafer during transport of the wafer to or from the pedestal.

In one embodiment, the carrier ring includes a plurality of carrier ring wafer supports defined on the step down surface of the carrier ring, the carrier ring wafer supports being configured to engage the wafer when the wafer is supported by the carrier ring during transport.

In another embodiment, a process chamber for depositing a film on a wafer is provided, comprising: a pedestal configured to receive the wafer, the pedestal having, a central top surface extending from a central axis of the pedestal to a top surface diameter, the central top surface having a plurality of wafer supports defined thereon, the wafer supports configured to support the wafer at a support level above the central top surface, an annular surface extending from the top surface diameter to an outer diameter of the annular surface, the annular surface being at a step down from the central top surface, a plurality of carrier ring supports positioned at the outer diameter of the annular surface; a carrier ring having an annular body with a bottom surface and a top surface, the bottom surface of the annular body of the carrier ring configured to be supported by the carrier ring supports such that the bottom surface of the annular body is at a first vertical separation above the annular surface, the carrier ring having an inner diameter and a step down surface is defined proximate to the inner diameter, the step down surface being relative to the top surface that extends from the step down surface to an outer diameter of the annular body; wherein when the carrier ring is seated on the carrier ring supports, then the step down surface of the carrier ring is positioned at a process level that is at a second vertical separation from the support level over the top surface of the pedestal; wherein the first vertical separation defines a lower gap between the bottom surface of the carrier ring and the annular surface, the lower gap being less than about 0.15 mm, and the second vertical separation defines an upper gap between the step down surface of the carrier ring and a wafer when supported on the plurality of wafer supports on the pedestal, the upper gap being less than about 0.15 mm; wherein an edge of the wafer is configured to overhang over the top surface diameter so that the edge of the wafer overhangs and resides over the step down surface of the carrier ring when the wafer is present in the process chamber and supported on the wafer supports; wherein the lower gap and the upper gap limit access to a backside of the wafer during a deposition process, the lower gap and upper gap limiting deposition on the backside of the wafer at an edge region of the wafer to less than about 20% of deposition on a front side of the wafer at the edge region, the edge region being defined at approximately 3 mm from the edge of the wafer.

In one embodiment, the lower gap is about 0.1 mm or less; the upper gap is about 0.1 mm or less.

In one embodiment, each carrier ring support is height adjustable to define the first vertical separation above the annular surface at which the bottom surface of the carrier ring is positioned when the carrier ring is supported by the carrier ring supports.

In one embodiment, at least one of the carrier ring supports includes one or more spacers for adjusting the height of the at least one of the carrier ring supports.

In one embodiment, the plurality of carrier ring supports defines at least three carrier ring supports symmetrically positioned at the outer diameter of the annular surface.

In one embodiment, the carrier ring is configured to support the wafer during transport of the wafer to or from the pedestal; the carrier ring includes a plurality of carrier ring wafer supports defined on the step down surface of the carrier ring, the carrier ring wafer supports being configured to engage the wafer when the wafer is supported by the carrier ring during transport.

In one embodiment, the deposition process is an atomic layer deposition (ALD) process.

In another embodiment, a process chamber for depositing a film on a wafer is provided, comprising: a pedestal configured to receive the wafer, the pedestal having, a central top surface extending from a central axis of the pedestal to a top surface diameter, the central top surface having a plurality of wafer supports defined thereon, the wafer supports configured to support the wafer at a support level above the central top surface, an annular surface extending from the top surface diameter to an outer diameter of the annular surface, the annular surface being at a step down from the central top surface, a plurality of carrier ring supports positioned at the outer diameter of the annular surface; a carrier ring having an annular body with a bottom surface and a top surface, the bottom surface of the annular body of the carrier ring configured to be supported by the carrier ring supports such that the bottom surface of the annular body is at a first vertical separation above the annular surface, the carrier ring having an inner diameter and a step down surface is defined proximate to the inner diameter, the step down surface being relative to the top surface that extends from the step down surface to an outer diameter of the annular body; wherein when the carrier ring is seated on the carrier ring supports, then the step down surface of the carrier ring is positioned at a process level that is at a second vertical separation from the support level over the top surface of the pedestal; wherein the first vertical separation defines a lower gap between the bottom surface of the carrier ring and the annular surface, the lower gap being about 0.1 mm or less, and the second vertical separation defines an upper gap between the step down surface of the carrier ring and a wafer when supported on the plurality of wafer supports on the pedestal, the upper gap being about 0.1 mm or less; wherein an edge of the wafer is configured to overhang over the top surface diameter so that the edge of the wafer overhangs and resides over the step down surface of the carrier ring when the wafer is present in the process chamber and supported on the wafer supports; wherein the lower gap and the upper gap limit access by process gases to a backside of the wafer during a deposition process, the lower gap and upper gap limiting deposition on the backside of the wafer at an edge region of the wafer to less than about 20% of deposition on a front side of the wafer at the edge region, the edge region being defined at approximately 3 mm from the edge of the wafer.

In one embodiment, the deposition process is an atomic layer deposition (ALD) process.

DESCRIPTION

Embodiments of the disclosure provide embodiments of a process chamber, used for processing semiconductor wafers.

It should be appreciated that the present embodiments can be implemented in numerous ways, such as a process, an apparatus, a system, a device, or a method. Several embodiments are described below.

Deposition of films can be implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

Figure 1A:
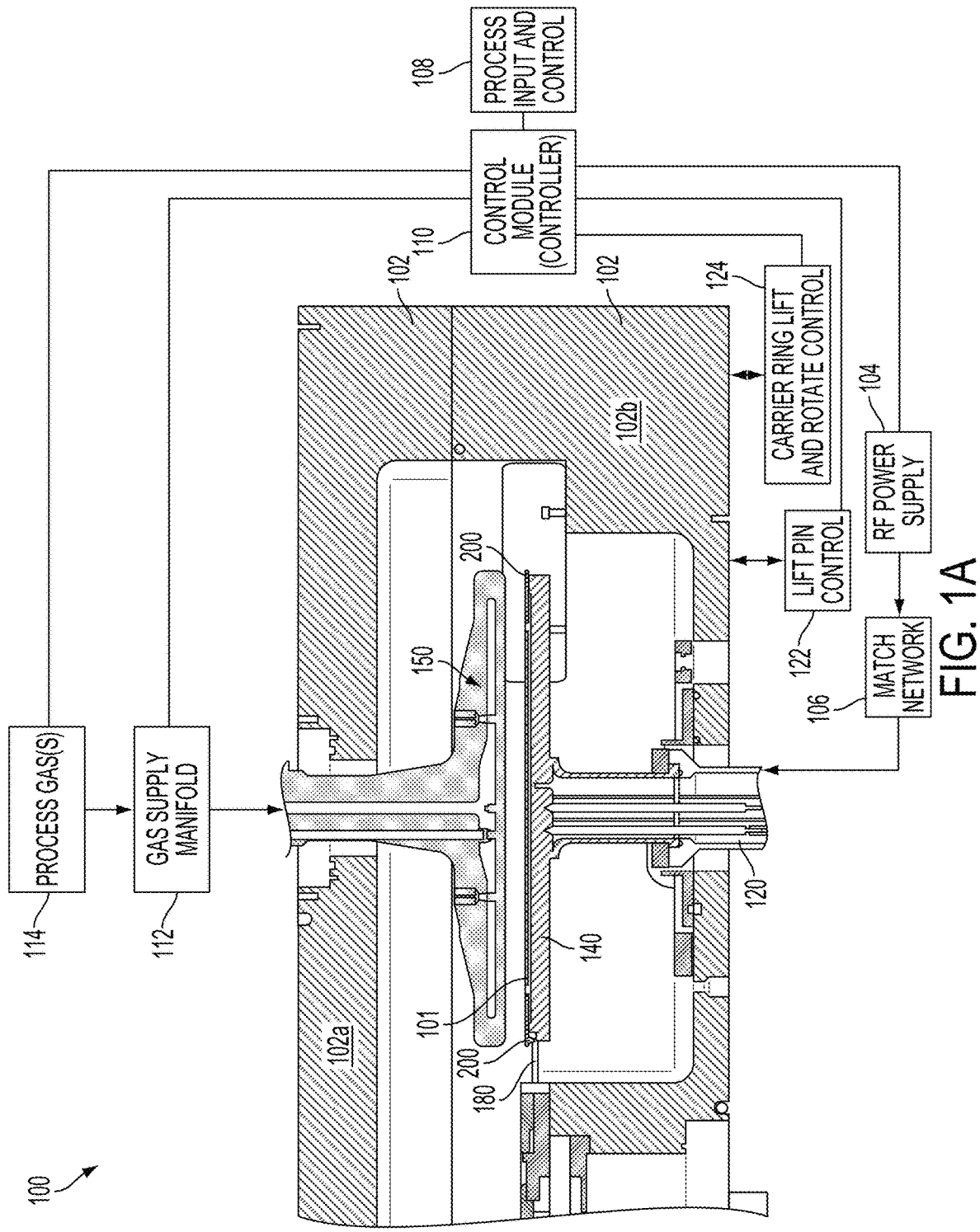
FIG. 1A illustrates a substrate processing system, which is used to process a wafer, e.g., to form films thereon.

FIG. 1A illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face that faces the wafer 101 and the wafer 101 resting over the pedestal 140.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring is configured to support the wafer during transport of the wafer to or from the pedestal. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system.

Figure 1B:
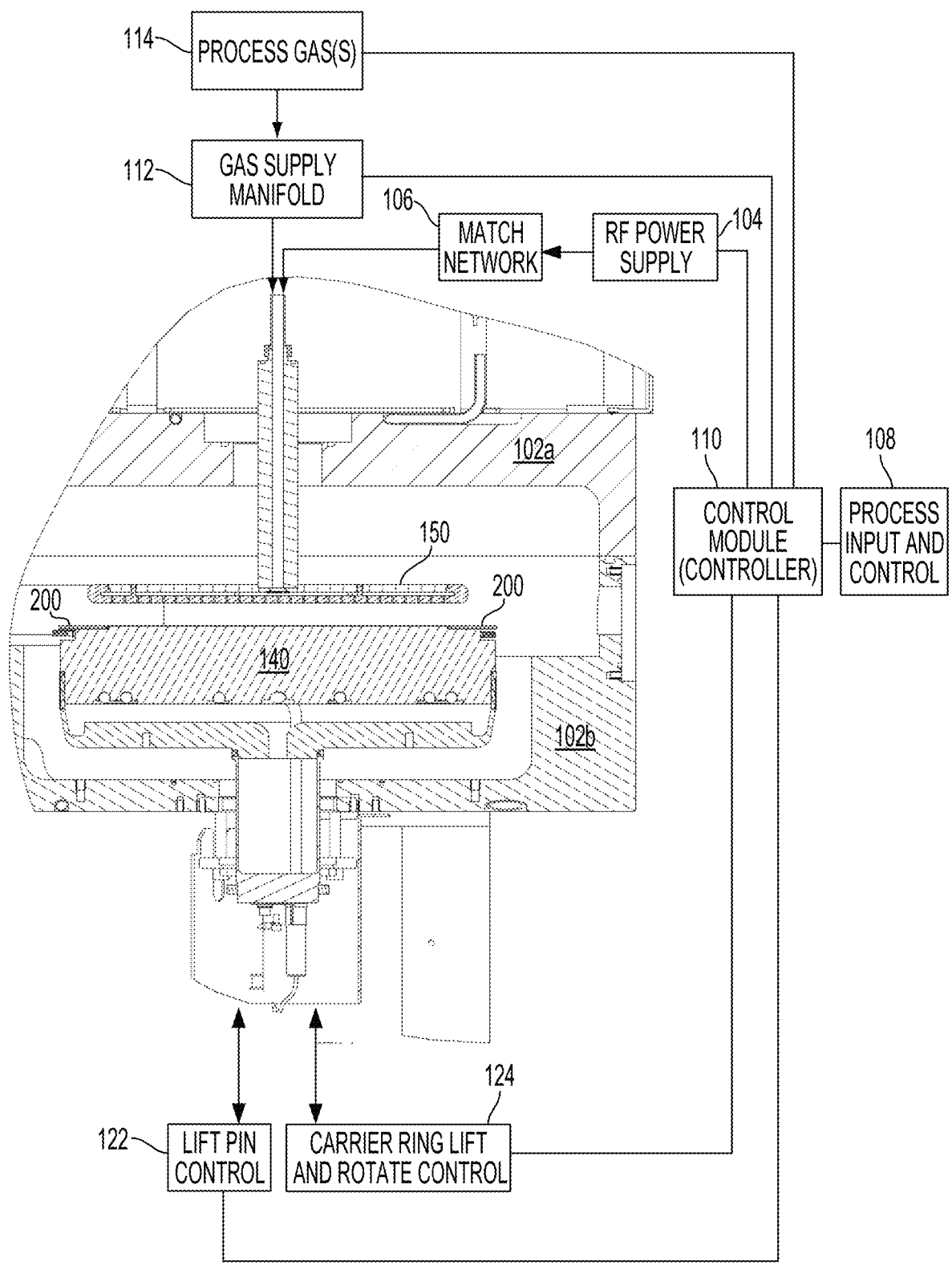
FIG. 1B illustrates a substrate processing system that is configured to perform an atomic layer deposition (ALD) process on a wafer.

FIG. 1B illustrates a substrate processing system that is configured to perform an atomic layer deposition (ALD) process on a wafer (e.g. an ALD oxide process). Similar componentry as that described with reference to FIG. 1A is shown. However, RF power is supplied to the showerhead 150.

Figure 2:
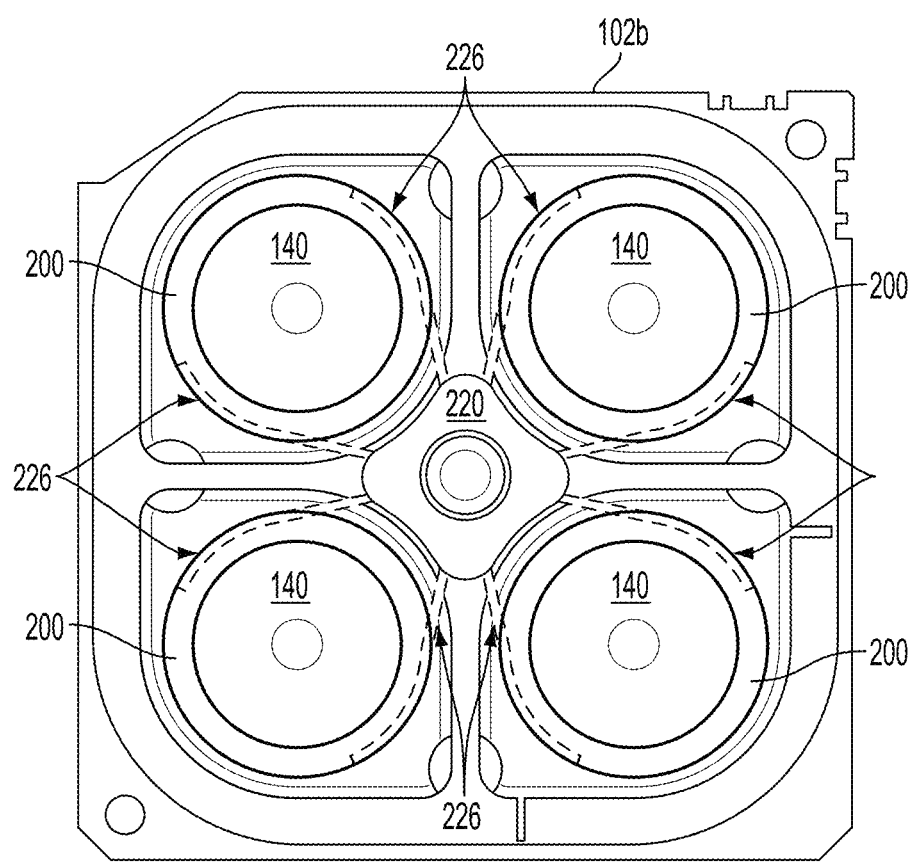
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork, includes a first and second arm, each of which is positioned around a portion of each side of the pedestal 140. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3A:
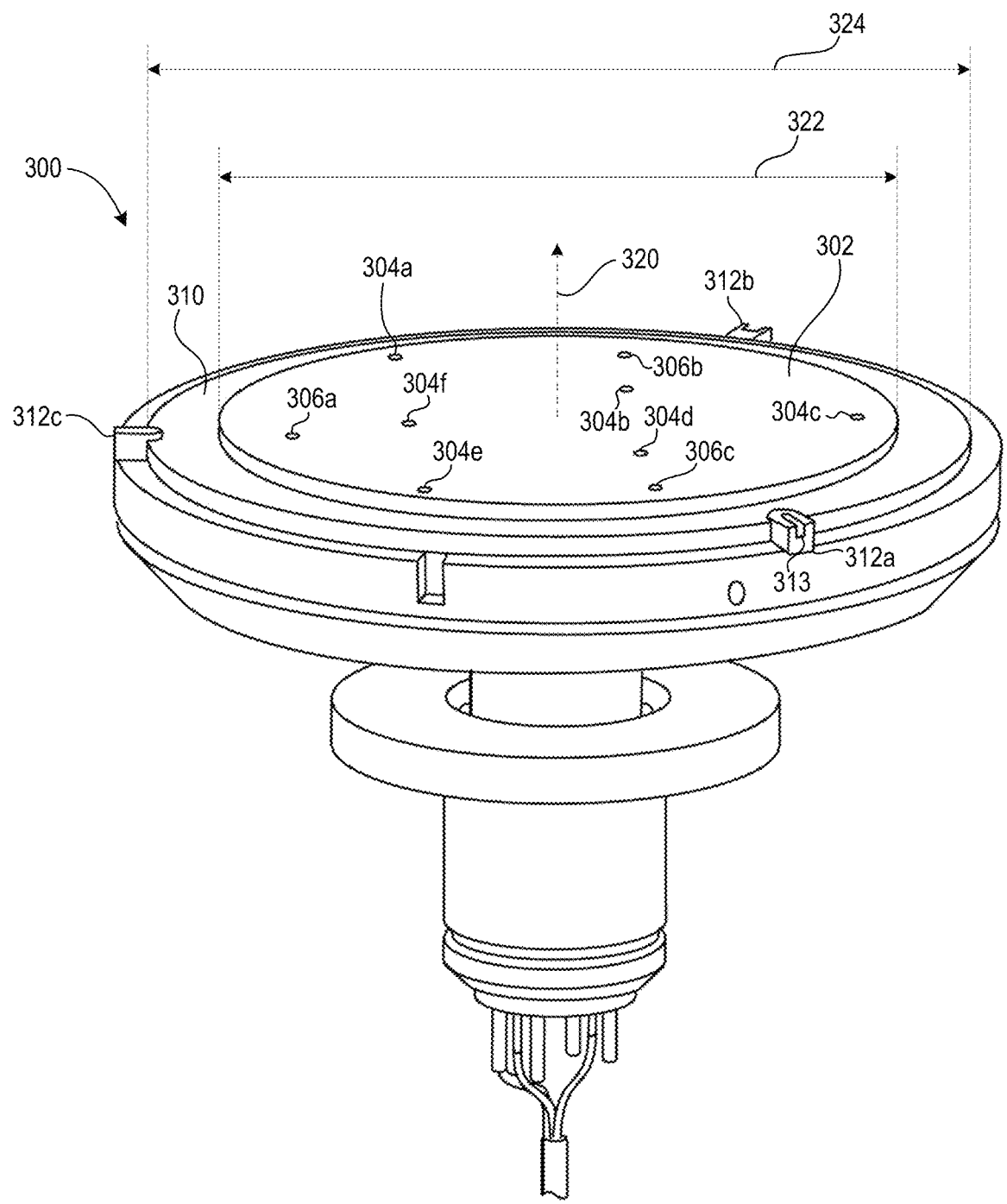
FIG. 3A illustrates a pedestal 300 that is configured to receive a wafer for a deposition process, such as an atomic layer deposition (ALD) process, in accordance with an embodiment of the invention.

FIG. 3A illustrates a pedestal 300 that is configured to receive a wafer for a deposition process, such as an atomic layer deposition (ALD) process. The wafer includes a central top surface 302 that is defined by a circular area extending from a central axis 320 of the pedestal to a top surface diameter 322 that defines the edge of the central top surface. The central top surface 302 includes a plurality of wafer supports 304a, 304b, 304c, 304d, 304e, and 304f, which are defined on the central top surface 302 and configured to support the wafer at a support level above the central top surface. The wafer support level is defined by the vertical position of the bottom surface of a wafer when seated on the wafer supports. In some implementations, the wafer support level is approximately 2 mil above the central top surface 302 of the pedestal. In the illustrated embodiment, there are six wafer supports symmetrically distributed about a peripheral portion of the central top surface 302. However, in other implementations there may be any number of wafer supports on the central top surface 302, which may be distributed about the central top surface 302 in any suitable configuration for supporting the wafer during deposition process operations. Additionally shown are recesses 306a, 306b, and 306c, which are configured to house lift pins. As noted above, the lift pins can be utilized to raise the wafer from the wafer supports to allow for engagement by an end-effector.

In some embodiments, each wafer support defines a minimum contact area (MCA). MCA's are used to improve precision mating between surfaces when high precision or tolerances are required, and/or minimal physical contact is desirable to reduce defect risk. Other areas in the system can utilize MCA's, such as over the carrier ring supports, and over the inner wafer support region of the carrier ring, as described in further detail below.

The pedestal 300 further includes an annular surface 310 extending from the top surface diameter 322 of the pedestal (which is at the outer edge of the central top surface 302) to an outer diameter 324 of the annular surface. The annular surface 310 defines an annular region surrounding the central top surface 302, but at a step down from the central top surface. That is, the vertical position of the annular surface 310 is lower than the vertical position of the central top surface 302. A plurality of carrier ring supports 312a, 312b, and 312c are positioned substantially at/along the edge (outer diameter) of the annular surface 310 and symmetrically distributed about the annular surface. The carrier ring supports can in some embodiments define MCA's for supporting the carrier ring. In some implementations, the carrier ring supports 312a, 312b, and 312c extend beyond the outer diameter 324 of the annular surface whereas in other implementations they do not. In some implementations, the top surfaces of the carrier ring supports have a height that is slightly higher than that of the annular surface 310, so that when a carrier ring is resting on the carrier ring supports, then the carrier ring is supported at a predefined distance above the annular surface. Each carrier ring support may include a recess, such as recess 313 of carrier ring support 312a, in which an extension protruding from the underside of the carrier ring is seated when the carrier ring is supported by the carrier ring supports. The mating of the carrier ring extensions to the recesses in the carrier ring supports provides for secure positioning of the carrier ring and prevents the carrier ring from moving when seated on the carrier ring supports.

In some implementations, the top surfaces of the carrier ring supports are flush with the annular surface 310, or in other implementations, there are no carrier ring supports separately defined from the annular surface, so that the carrier ring may rest directly on the annular surface. The result is that no gap exists between the carrier ring and the annular surface 310. In such implementations, the pathway between the carrier ring and the annular surface 310 is closed, preventing precursors from accessing the wafer backside via this pathway.

In the illustrated embodiment, there are three carrier ring supports positioned symmetrically along the outer edge region of the annular surface. However, in other implementations, there may be three or more carrier ring supports, distributed at any locations along the annular surface 310 of the pedestal 300, to support a carrier ring in a stable resting configuration.

It will be appreciated that when the wafer is supported by the wafer supports and the carrier ring is supported by the carrier ring supports, then an edge region of the wafer is disposed over an inner portion of the carrier ring. Generally speaking, the edge region of the wafer extends from an outer edge of the wafer inward by about two to five millimeters (mm) A vertical separation is thereby defined between the edge region of the wafer and the inner portion of the carrier ring. In some embodiments, this vertical separation is about one to ten mil.

It will be appreciated that the support of the carrier ring at the predefined distance above the annular surface, as well as the separation between the edge region of the wafer and the inner portion of the carrier ring, can be controlled so as to limit deposition on a backside of the wafer in the edge region of the wafer.

Figure 3B:
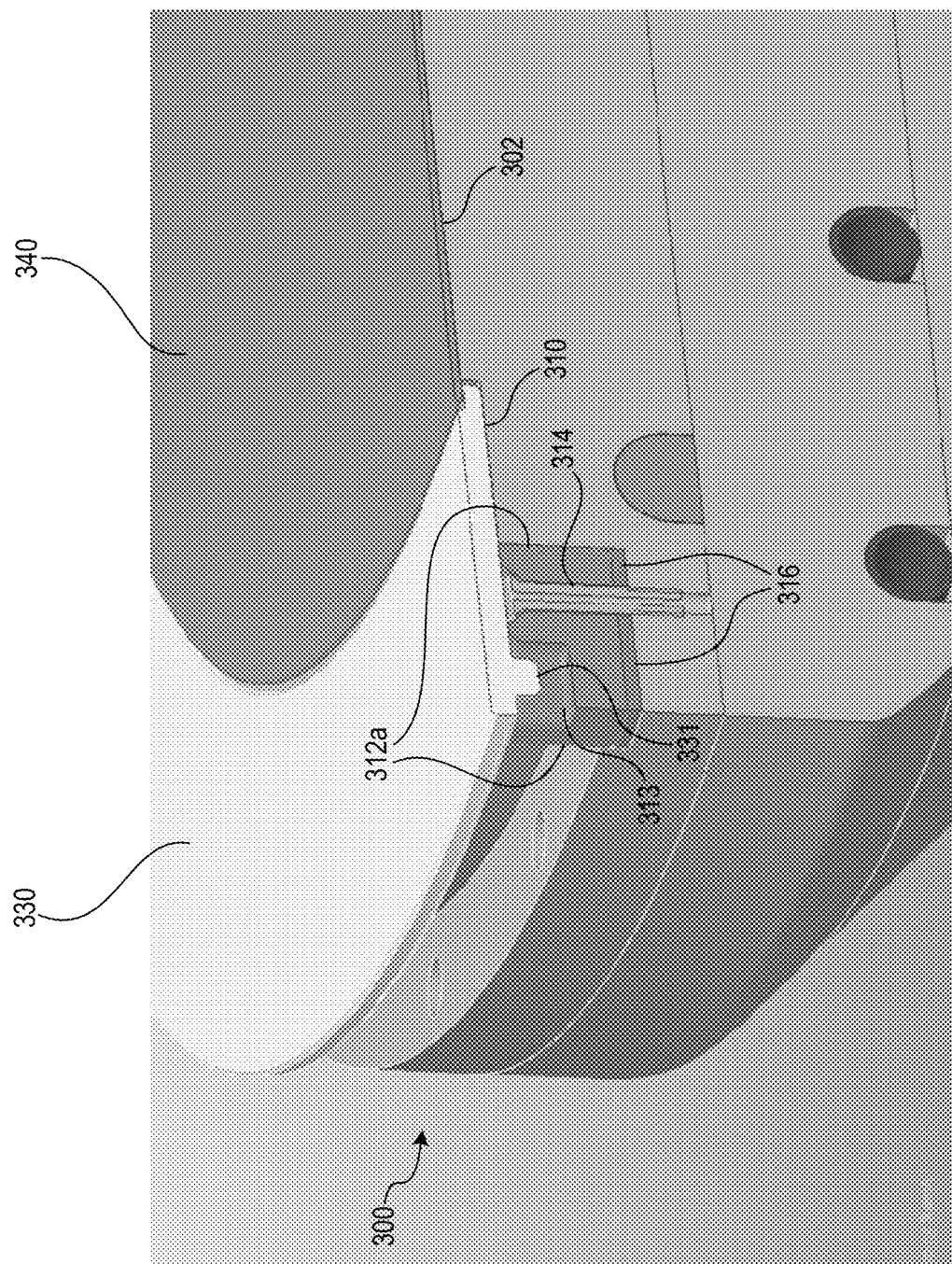
FIG. 3B illustrates a perspective cutaway view of a portion of the pedestal 300, in accordance with an embodiment of the invention.

FIG. 3B illustrates a perspective cutaway view of a portion of the pedestal 300, in accordance with an embodiment of the invention. The cutaway view is a longitudinal section intersecting one of the carrier ring supports, e.g. carrier ring support 312a. A carrier ring 330 is shown resting atop the carrier ring support 312a. In this configuration, the carrier ring extension 331 is seated within the recess 313 of the carrier ring support 312a. Also, a wafer 340 is shown resting over the central top surface 302 of the pedestal (supported by wafer supports). The carrier ring support 312a is height adjustable, so as to allow the distance above the annular surface 310 at which the carrier ring is supported to be adjusted. In some implementations, the carrier ring support 312a includes a spacer (e.g. a shim) 316 for adjusting the height of the at least one of the carrier ring supports. That is, the spacer 316 is selected to provide for a controlled distance between the carrier ring 330 and the annular surface 310 when the carrier ring is resting on the carrier ring supports. It will be appreciated that there may be zero, one, or more than one spacers 316 selected and positioned beneath the carrier ring support 312a, to provide for the desired distance between the annular surface 310 and the carrier ring 330.

Additionally, the carrier ring support 312a and the spacer(s) 316 are secured to the pedestal by fastening hardware 314. In some implementations, the hardware 314 can be a screw, bolt, nail, pin, or any other type of hardware suitable for securing the carrier ring support and spacer(s) to the pedestal. In other implementations, other techniques/materials for securing the carrier ring support and spacers to the pedestal can be utilized, such as a suitable adhesive.

Figure 3C:
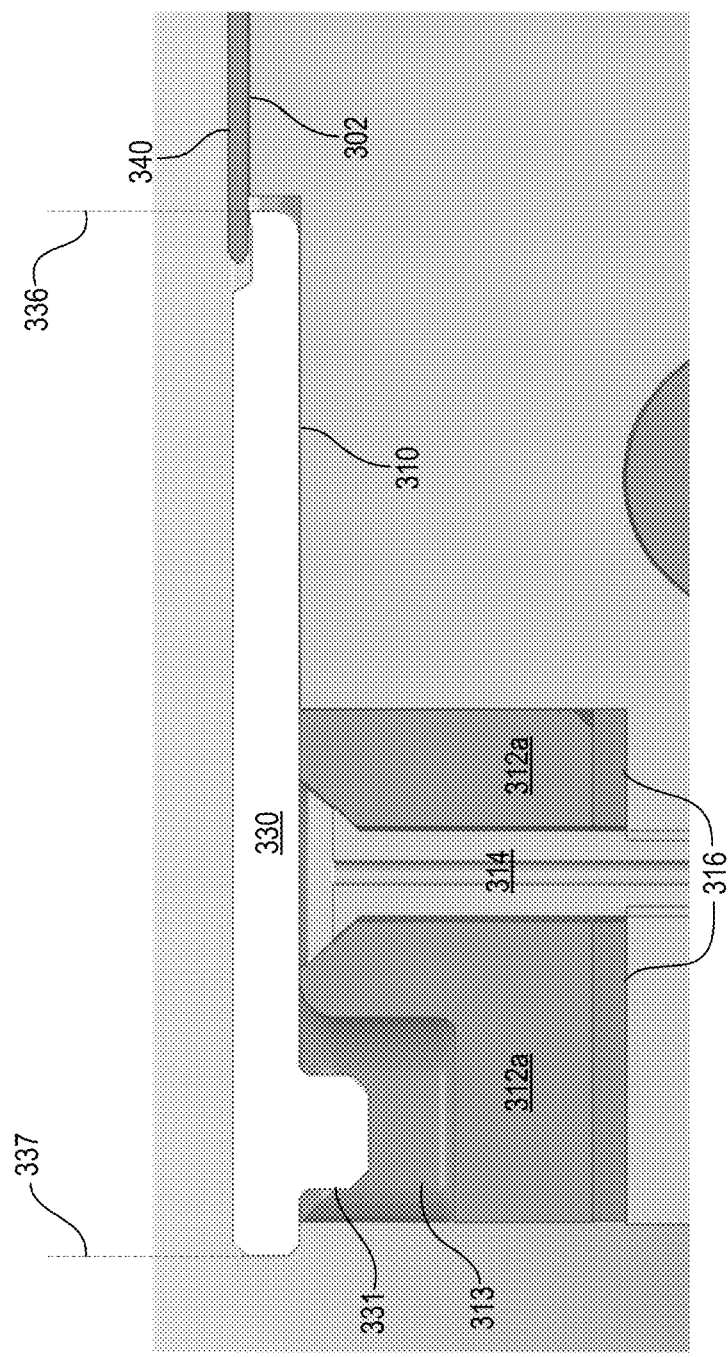
FIG. 3C illustrates a cross-section view of a peripheral portion of the pedestal 300, including carrier ring 330 and an edge portion of the wafer 340, in accordance with an embodiment of the invention.

FIG. 3C illustrates a cross-section view of a peripheral portion of the pedestal 300, including carrier ring 330 and an edge portion of the wafer 340, in accordance with an embodiment of the invention. As can be seen, the total height of the carrier ring support 312a is defined by the combined heights of the spacer/shim 316 and the carrier ring support 312a. This also determines the extent to which the top surface of the carrier ring support 312a is higher than the annular surface 310 of the pedestal 300.

Figure 3D:
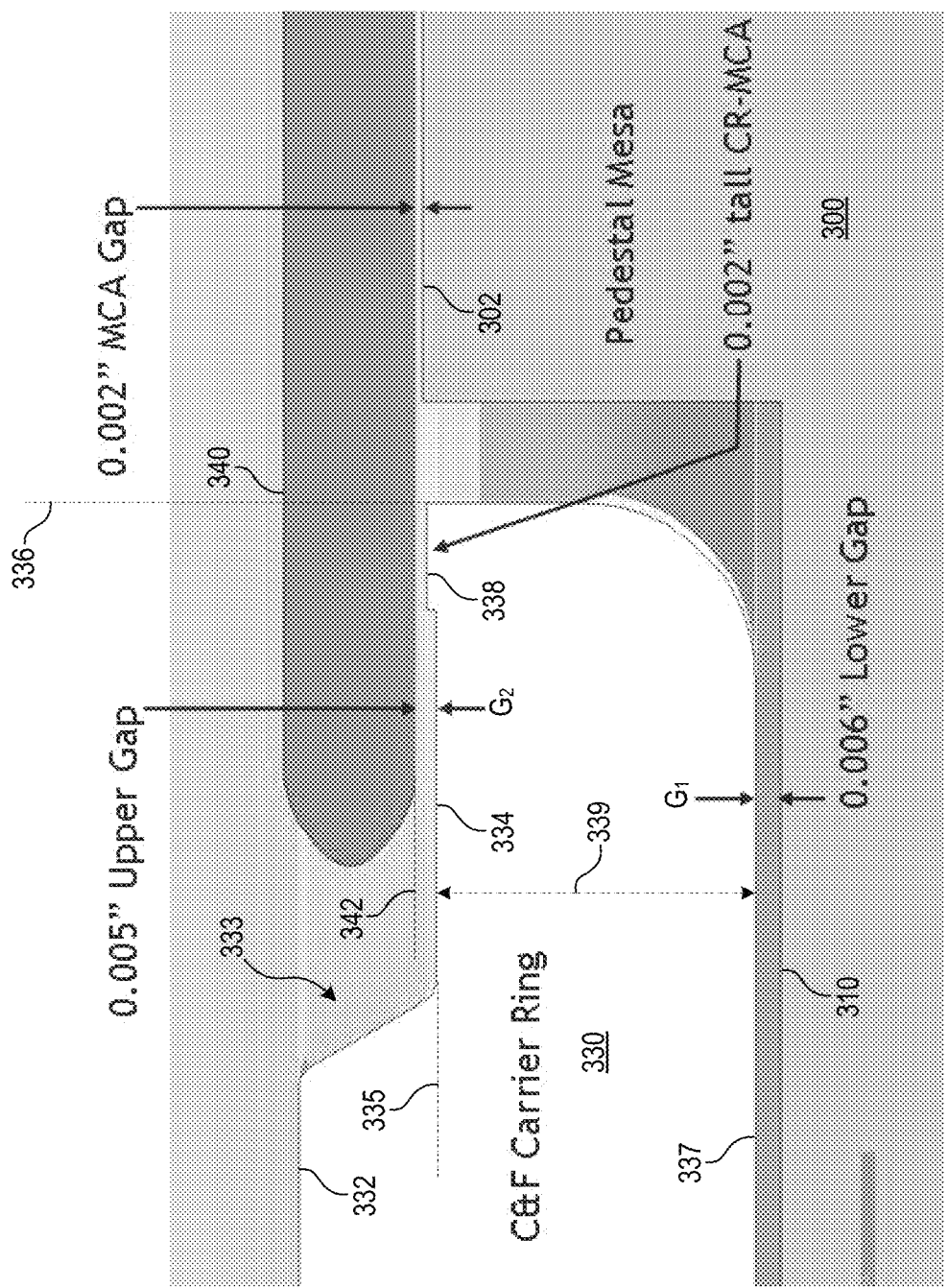
FIG. 3D illustrates a cross-section view of the carrier ring 330 and wafer 340, showing the various gaps which provide a pathway for transport of precursors and radical species to the wafer backside, in accordance with an embodiment of the invention.

FIG. 3D illustrates a cross-section view of the carrier ring 330 and wafer 340, showing the various gaps which provide a pathway for transport of precursors and radical species to the wafer backside, in accordance with an embodiment of the invention. In the illustrated embodiment, the carrier ring 340 is an annular body having a top surface 332, and a step down surface 334. The top surface 332 and the step down surface 334 are joined by a transition step 333. It will be appreciated that the step down surface 334 is defined proximate to the inner diameter 336 of the carrier ring, and extends outward from the inner diameter 336. The top surface 332 extends from the step down surface to the outer diameter 337 (shown at FIG. 3C) of the carrier ring 330. The carrier ring 330 further includes a plurality of carrier ring wafer supports 338 which are defined along the step down surface 334 of the carrier ring 330. The carrier ring wafer supports 338 may be MCA's and are configured to engage the backside of the wafer 340 when the wafer 340 is being supported by the carrier ring 330 (e.g. during transport).

As shown, a lower gap (carrier ring-to-pedestal gap) $G_1$ exists between the bottom surface of the carrier ring 330 and the annular surface 310 of the pedestal 300. Additionally, there exists an upper gap (wafer-to-carrier ring gap) $G_2$ between a top surface of the carrier ring 330 (over which an edge region of the wafer is disposed) and the backside of the wafer 340. It will be appreciated that each of the lower gap and the upper gap provide pathways for precursors and radical species to be transported to the wafer backside during deposition processing. Therefore, by controlling these gaps, backside deposition can be controlled as well.

The size of the lower gap $G_1$ is defined by the vertical separation between the annular surface 310 and the bottom surface 337 of the carrier ring 330, when the carrier ring 330 is supported by the carrier ring supports (312a, 312b, 312c).

The wafer 340 is supported by the wafer supports at a support level 342 above the central top surface, which is the vertical position defined by wafer backside. When the carrier ring 330 is seated on the carrier ring supports, the step down surface 334 defines a process level 335. The size of the upper gap $G_2$ between the wafer 340 and the carrier ring 330 is defined by the vertical separation between the process level 335 (the vertical position of the step down surface 334 when the carrier ring is supported by the carrier ring supports) and the wafer support level 342 (the vertical position of the backside of the wafer when the wafer is supported by the wafer supports).

It will be appreciated that the size of the upper gap $G_2$ results from a variety of factors, including the size of the lower gap $G_1$, the thickness 339 of the carrier ring 330 in the region of the step down surface 334 (over which the edge of the wafer 340 is disposed during processing), the difference in vertical position between the annular surface 310 and the central top surface 302 of the pedestal 300, the distance above the central top surface that the wafer 340 is maintained by the wafer supports (e.g. as defined by the MCA's on the central top surface). By carefully controlling the lower gap and the upper gap, backside deposition can be controlled.

In some implementations, the lower gap $G_1$ is less than about six mil (i.e. 0.006 inches; 0.15 mm). In some implementations, the lower gap $G_1$ is in the range of about zero to four mil (i.e. 0.000 to 0.004 inches; 0.00 to 0.10 mm). In some implementations, the upper gap is in the range of about one to ten mil (i.e. 0.001 to 0.010 inches; 0.03 to 0.25 mm). In some implementations, the upper gap is in the range of about two to eight mil (0.002 to 0.008 inches; 0.05 to 0.20 mm). In some implementations, the upper gap is in the range of about three to seven mil (0.003 to 0.007 inches; 0.08 to 0.18 mm). In some implementations, the upper gap is approximately six mil (0.006 inches; 0.15 mm).

Figure 4A:
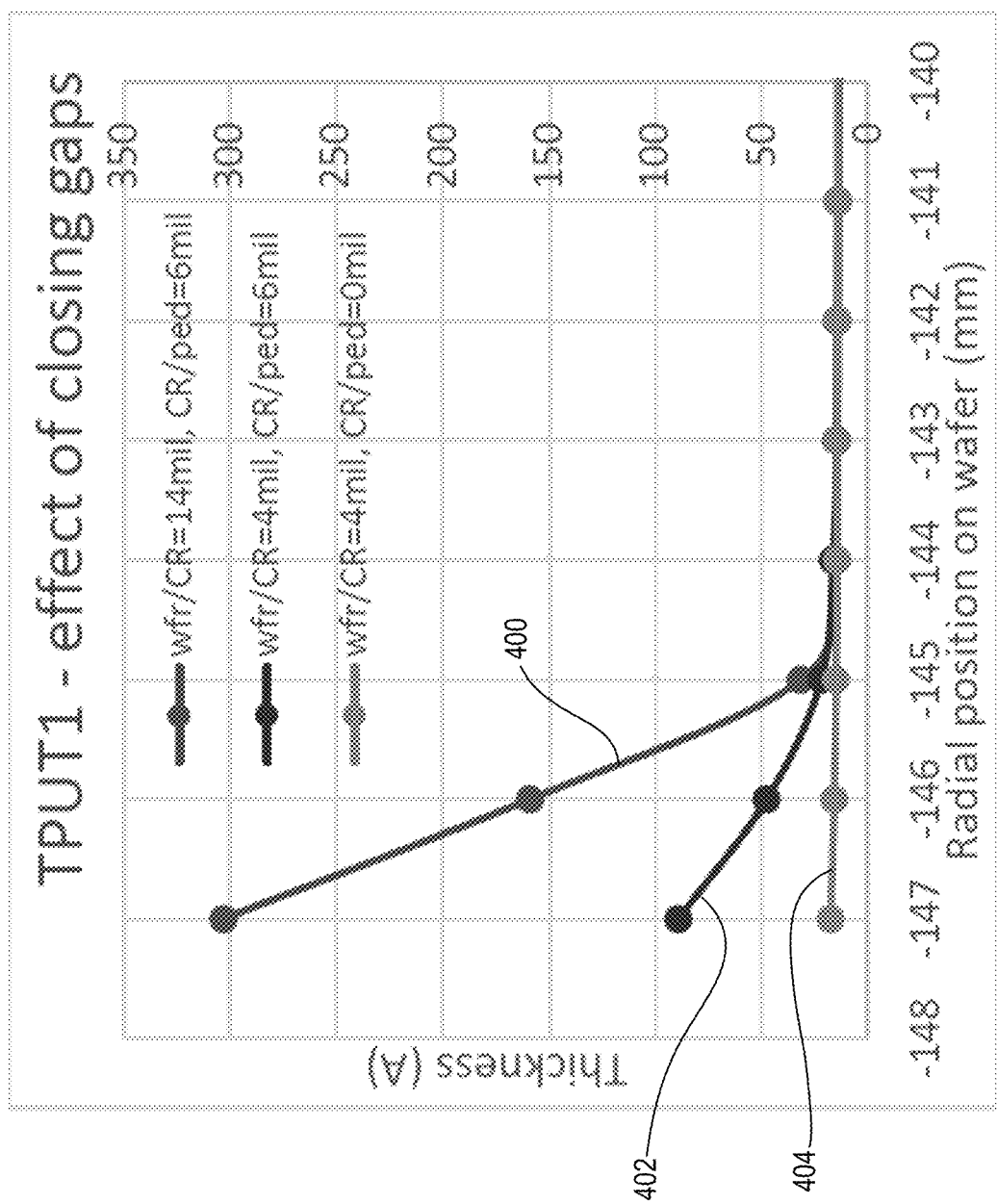
FIGS. 4A and 4B illustrate graphs showing backside deposition thickness versus radial position on a wafer, in accordance with an embodiment of the invention.
Figure 4B:
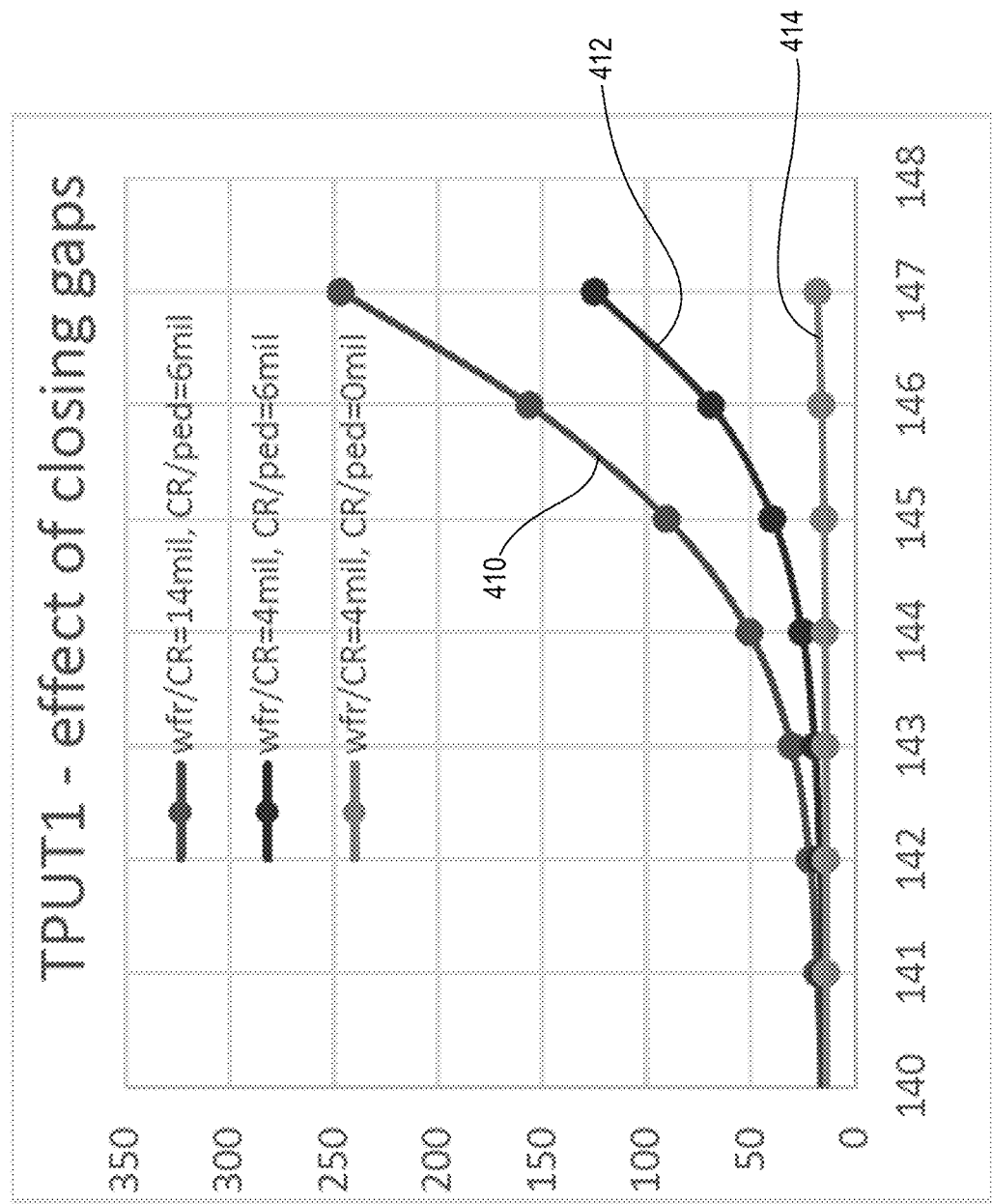

FIGS. 4A and 4B illustrate graphs showing backside deposition thickness versus radial position on a 300 mm wafer, in accordance with an embodiment of the invention. Silicon oxide was deposited by ALD utilizing a 50 degree Celsius process. The deposition thickness was measured along a diameter of the wafer aligned with the wafer notch. From a position of 0 mm at the wafer center, the radial position may extend to +/−150 mm along the diameter, with −150 mm being at the wafer notch, and 150 mm being at the furthest edge opposite the wafer notch.

FIG. 4A shows the backside deposition thickness at the edge region near the wafer notch, from −147 mm (i.e. 3 mm inward from the edge), extending inward to −140 mm. Curve 400 indicates deposition thickness for a setup having a wafer-to-carrier ring gap of approximately 14 mil (i.e. 0.014 inches; 0.36 mm) and a carrier ring-to-pedestal gap of approximately 6 mil (i.e. 0.006 inches; 0.15 mm). Curve 402 indicates deposition thickness for a setup having a wafer-to-carrier ring gap of approximately 4 mil (i.e. 0.004 inches; 0.10 mm) and a carrier ring-to-pedestal gap of approximately 6 mil (i.e. 0.006 inches; 0.15 mm). Curve 404 indicates deposition thickness for a setup having a wafer-to-carrier ring gap of approximately 4 mil (i.e. 0.004 inches; 0.10 mm) and a carrier ring-to-pedestal gap of approximately 0 mil. The frontside deposition thickness was approximately 350 angstroms.

As indicated by the curve 400, the backside deposition thickness at −147 mm was approximately 300 angstroms, which is approaching the 350 angstrom deposition thickness observed on the frontside of the wafer. As indicated by curve 402, by reducing the wafer-to-carrier ring gap from 14 mil to 4 mil, the backside deposition thickness at −147 mm is reduced by more than half, to about 90 angstroms. And as indicated by curve 404, additionally reducing the carrier ring-to-pedestal gap from 6 mil to 0 mil provides a further reduction in deposition thickness at −147 mm to a nominal amount of about 20 angstroms. This is close to the thickness of native oxide on the wafer, which is typically in the range of about 15 angstroms.

FIG. 4B illustrates similar results for the edge region opposite the wafer notch. Curve 410 indicates deposition thickness for the setup having a wafer-to-carrier ring gap of approximately 14 mil (i.e. 0.014 inches; 0.36 mm) and a carrier ring-to-pedestal gap of approximately 6 mil (i.e. 0.006 inches; 0.15 mm). Curve 412 indicates deposition thickness for a setup having a wafer-to-carrier ring gap of approximately 4 mil (i.e. 0.004 inches; 0.10 mm) and a carrier ring-to-pedestal gap of approximately 6 mil (i.e. 0.006 inches; 0.15 mm). Curve 414 indicates deposition thickness for a setup having a wafer-to-carrier ring gap of approximately 4 mil (i.e. 0.004 inches; 0.10 mm) and a carrier ring-to-pedestal gap of approximately 0 mil. The frontside deposition thickness was approximately 350 angstroms.

As indicated by the curve 410, the backside deposition thickness at 147 mm was approximately 250 angstroms. As indicated by curve 402, by reducing the wafer-to-carrier ring gap from 14 mil to 4 mil, the backside deposition thickness at 147 mm is reduced by about half, to about 125 angstroms. And as indicated by curve 414, additionally reducing the carrier ring-to-pedestal gap from 6 mil to 0 mil provides a further reduction in deposition thickness at 147 mm to a nominal amount of about 20 angstroms.

Figure 5:
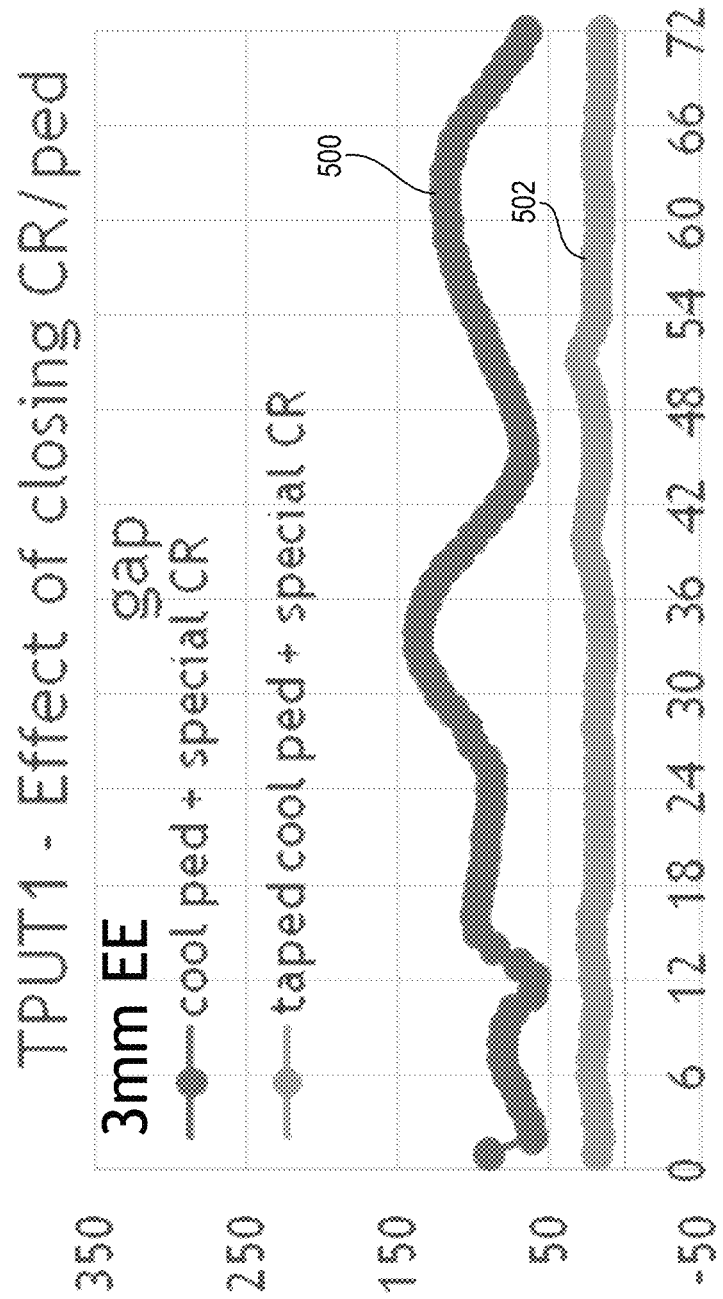
FIG. 5 illustrates a graph showing a circular scan of backside deposition thickness at a fixed radial position of 3 mm from the wafer edge.

FIG. 5 illustrates a graph showing a circular scan of backside deposition thickness at a fixed radial position of 3 mm from the wafer edge. Silicon oxide was deposited by ALD employing a 50 degree Celsius process. Curve 500 illustrates deposition thickness at 3 mm from the wafer edge for a setup having a wafer-to-carrier ring gap of approximately 4 mil and a carrier ring-to-pedestal gap of approximately 6 mil. As can be seen, the backside deposition thickness varies between about 50 and 150 angstroms.

Curve 502 indicates deposition thickness at 3 mm from the wafer edge for a setup having a wafer-to-carrier ring gap of approximately 4 mil and a carrier ring-to-pedestal gap of approximately 0 mil. The zero carrier ring-to-pedestal gap was achieved by applying 6 mil Kapton tape on the pedestal to eliminate the height differential between the carrier ring supports and the adjacent pedestal surface (the aforementioned annular surface of the pedestal). As can be seen, the backside deposition thickness is reduced to less than 25 angstroms.

In another experiment, deposition thickness was compared between two setups, both having a carrier ring-to-pedestal gap of 6 mil, but differing in terms of wafer-to-carrier ring gap. In one setup having a 6 mil carrier ring-to-pedestal gap and a 14 mil wafer-to-carrier gap (achieved using a standard carrier ring), a mean deposition thickness of less than 50 angstroms was observed at a radial position of 6 mm from the wafer edge. Whereas for a setup having a 6 mil carrier ring-to-pedestal gap and a reduction to a 4 mil wafer-to-carrier gap (achieved using a special carrier ring), a mean deposition thickness of less than 50 angstroms was observed at a radial position of 4-5 mm from the wafer edge.

In another experiment, deposition thickness was compared between two setups, both having zero carrier ring-to-pedestal gap, but differing in terms of wafer-to-carrier ring gap. In one setup having zero carrier ring-to-pedestal gap and a 14 mil wafer-to-carrier gap, a mean deposition thickness of less than 50 angstroms was observed at a radial position of 7 mm from the wafer edge. Whereas for a setup having zero carrier ring-to-pedestal gap and a reduction to a 4 mil wafer-to-carrier gap, a mean deposition thickness of less than 50 angstroms was observed at a radial position of 3 mm from the wafer edge.

However, in other implementations, the wafer-to-carrier ring gap can be reduced to below the limit defined by the carrier ring wafer supports/MCA's, by eliminating the carrier ring wafer supports on the carrier ring. Assuming the carrier ring wafer supports having a height of 3 mil (0.003 inches; 0.08 mm) above the step down surface of the carrier ring, then the wafer-to-carrier ring gap can be reduced to less than 3 mil through the elimination of the carrier ring wafer supports and the appropriate configuration of the remaining elements affecting the wafer-to-carrier ring gap.

Table A below provides experimental results of tests conducted with various configurations of the pedestal and carrier ring (CR=carrier ring; HS="horseshoe"-shaped carrier ring support). The modified CR has a thickness, at least in the region of the step down surface, of about 12 mil greater than the reference CR. All configurations were tested using an ALD process to deposit silicon oxide.

TABLE A

| CR MCA height | CR MCA to Wafer | Ped/wafer MCA Height | Nominal Top Gap | Bottom Gap | Configuration | Avg. Dep @ 3 mm (A) (including native oxide ~15 A) | Avg. Dep @ 4 mm (A) (including native oxide ~15 A) |
|---|---|---|---|---|---|---|---|
| 0.005" | .009" | 0.002" | 0.014" | 0.006" | reference CR on standard HS | 320-350 | 235 |
| 0.004" | 0.002" | 0.002" | 0.006" | 0.002" | modified CR with 4 mil MCA, modified HS with 2 mil shim | 210-230 | 140-153 |
| 0.002" | 0.002" | 0.002 | 0.004" | 0.004" | modified CR with 2 mil MCA, modified HS with 4 mil shim | 104-151 | 70-97 |
| 0.002" | 0.000" | 0.002 | 0.002" | 0.006" | modified CR with 2 mil MCA, standard HS | 104 | 63 |
| <0.001" | 0.003" | 0.002 | 0.004" | 0.004" | modified CR with 1 mil MCA, modified HS with 4 mil shim | 118 | 68 |
| <0.001" | 0.002" | 0.002 | 0.003" | 0.005" | modified CR with 1 mil MCA, modified HS with 5 mil shim | 35 | 26 |
| 0 | N/A | 0.002 | 0.003" | 0.005" | modified CR with 0 MCA, modified HS with 5 mil shim | 22-48 | 17-26 |

As demonstrated by the presently described results, reducing or even eliminating the gap between the carrier ring and the pedestal (annular surface) is beneficial for reducing backside deposition. Also, reducing the gap between the wafer and carrier ring is also beneficial in this respect. In some implementations, elimination of the wafer-to-carrier ring gap is avoided due to the possible risk of introducing defects on the wafer. In such implementations, it is desirable to minimize the wafer-to-carrier ring gap while maintaining a nominal gap that is suitable in view of the stack up of tolerances from multiple components which affect the wafer-to-carrier ring gap. In this respect, it is noted that while the carrier ring-to-pedestal gap is circumferentially consistent due to the rigidity of both the carrier ring and the pedestal structures, the wafer-to-carrier ring gap may vary due to the relative flexibility of the wafer. That is, due to wafer dimensions and depending on the wafer support configuration (e.g. number and location of wafer support MCA pins), some wafer plane deflection may occur under gravity and lead to variations in the observed wafer-to-carrier ring gap value as compared to a nominal calculated value. In particular, the wafer-to-carrier ring gap at the wafer edge can be smaller than the nominal gap, up to the limit defined by the carrier ring wafer supports/MCA's.

As shown, without MCAs on the carrier ring and a top gap of 0.003" and bottom gap of 0.005", the backside deposition is reduced from 320 angstroms to <50 angstroms at 3 mm from the edge, which is a more than 80% reduction in deposition. With this configuration, backside deposition at the edge is less than 10% of frontside deposition (after deduction of native oxide).

In one particular implementation, the wafer-to-carrier ring gap can be eliminated (wafer-to-carrier ring gap is reduced to zero). The carrier ring wafer supports are eliminated, and the other elements affecting the vertical positioning of the carrier ring and the wafer are configured so that the wafer edge is permitted to contact the carrier ring's step down surface throughout the wafer edge's circumference.

It will be appreciated that the lower gap and the upper gap limit access by process gases to a backside of the wafer during the deposition process. The result is that the lower gap and upper gap effectively limit deposition on the backside of the wafer at an edge region of the wafer to be less than the deposition on the front side of the wafer at the edge region (e.g. the edge region being defined at approximately 3 mm from the edge of the wafer). For example, in one embodiment, the system is configured so that backside deposition is limited to less than about 50% of frontside deposition. In another embodiment, backside deposition is limited to less than about 30% of frontside deposition. In another embodiment, backside deposition is limited to less than about 20% of frontside deposition. In another embodiment, backside deposition is limited to less than about 10% of frontside deposition.

Figure 6:
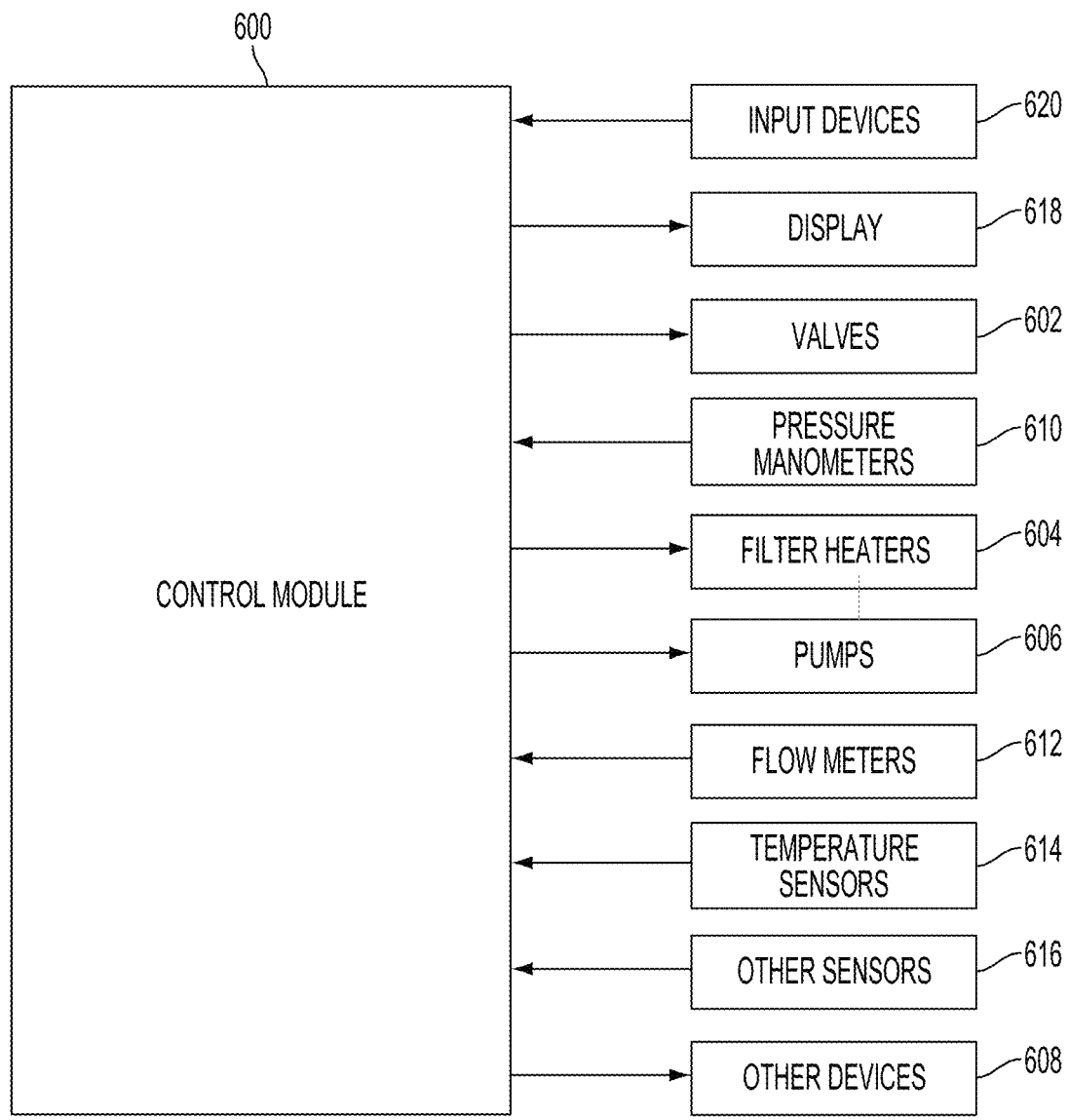
FIG. 6 shows a control module for controlling the systems, in accordance with one embodiment.

FIG. 6 shows a control module 600 for controlling the systems described above. In one embodiment, the control module 110 of FIG. 1 may include some of the example components. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A process chamber for depositing a film on a wafer, comprising:
   a pedestal configured to receive the wafer, the pedestal having,
      a central top surface extending from a central axis of the pedestal to a top surface diameter, the central top surface having a plurality of wafer supports defined thereon, the wafer supports configured to support the wafer during deposition processing at a support level above the central top surface,
      an annular surface extending from the top surface diameter to an outer diameter of the annular surface, the annular surface being at a step down from the central top surface,
      at least three separate carrier ring supports positioned at the outer diameter of the annular surface, the carrier ring supports extending radially inward of the outer diameter of the annular surface, the carrier ring supports being secured to the pedestal at a fixed height;

a carrier ring having an annular body with a bottom surface and a top surface, the bottom surface of the annular body of the carrier ring configured to be supported by the carrier ring supports during the deposition processing such that a substantially planar region of the bottom surface of the annular body is at a first vertical separation above the annular surface that is predetermined by the fixed height of the carrier ring supports, the carrier ring having an inner diameter and a step down surface is defined proximate to and surrounding the inner diameter, the step down surface being relative to the top surface that extends from the step down surface to an outer diameter of the annular body, wherein the carrier ring is configured to support the wafer during transport of the wafer to or from the pedestal;

wherein when the carrier ring is seated on the carrier ring supports, then the carrier ring surrounds the central top surface, and the step down surface of the carrier ring is positioned at a process level that is at a second vertical separation from the support level over the top surface of the pedestal;

wherein the first vertical separation defines a lower gap between the substantially planar region of the bottom surface of the carrier ring and the annular surface, and the second vertical separation defines an upper gap between the step down surface of the carrier ring, when the carrier ring is seated on the carrier ring supports, and a bottom surface of the wafer when the wafer is seated on the plurality of wafer supports on the pedestal, the upper gap being maintained at less than about 0.15 mm when the wafer is seated on the wafer supports during the deposition processing;

wherein an edge of the wafer is configured to overhang over the top surface diameter so that the edge of the wafer overhangs and resides over the step down surface of the carrier ring when the wafer is present in the process chamber and supported on the wafer supports:

wherein the carrier ring includes a plurality of carrier ring wafer supports defined on the step down surface of the carrier ring, the step down surface being an inner annular surface of the carrier ring, the carrier ring wafer supports being configured to engage the wafer when the wafer is supported by the carrier ring during transport, the carrier ring wafer supports protruding above the step down surface of the carrier ring by a height amount that is less than the second vertical separation.

2. The process chamber of claim 1, wherein the lower gap is less than about 0.15 mm.

3. The process chamber of claim 1, wherein the lower gap is about 0.1 mm or less.

4. The process chamber of claim 1, wherein the upper gap is about 0.1 mm or less.

5. The process chamber of claim 1, wherein at least one of the carrier ring supports is supported by a spacer that adjusts the height of the at least one of the carrier ring supports to the fixed height, to define the first vertical separation.

6. The process chamber of claim 5, wherein the at least one of the carrier ring supports and the spacer are secured to the pedestal by a fastener that extends through the at least one of the carrier ring supports and the spacer.

7. The process chamber of claim 1, wherein the at least three carrier ring supports are symmetrically positioned at the outer diameter of the annular surface.

8. The process chamber of claim 1, wherein the lower gap and the upper gap limit access by process gases to a backside of the wafer during a deposition process, the lower gap and upper gap limiting deposition on the backside of the wafer at an edge region of the wafer to less than about 20% of deposition on a front side of the wafer at the edge region, the edge region being defined at approximately 3 mm from the edge of the wafer.

9. The process chamber of claim 1, wherein the deposition process is an atomic layer deposition (ALD) process.

10. The process chamber of claim 1, wherein each carrier ring support includes a recess, the recess configured to receive an extension protruding from the bottom surface of the annular body of the carrier ring.

11. The process chamber of claim 10, wherein each carrier ring support is horseshoe-shaped.

12. A process chamber for depositing a film on a wafer, comprising:

a pedestal configured to receive the wafer, the pedestal having, a central top surface extending from a central axis of the pedestal to a top surface diameter, the central top surface having a plurality of wafer supports defined thereon, the wafer supports configured to support the wafer during deposition processing at a support level above the central top surface, an annular surface extending from the top surface diameter to an outer diameter of the annular surface, the annular surface being at a step down from the central top surface, at least three separate carrier ring supports positioned at the outer diameter of the annular surface, the carrier ring supports extending radially inward of the outer diameter of the annular surface, the carrier ring supports being secured to the pedestal at a fixed height;

a carrier ring having an annular body with a bottom surface and a top surface, the bottom surface of the annular body of the carrier ring configured to be supported by the carrier ring supports during the deposition processing such that a substantially planar region of the bottom surface of the annular body is at a first vertical separation above the annular surface that is predetermined by the fixed height of the carrier ring supports, the carrier ring having an inner diameter and a step down surface is defined proximate to and surrounding the inner diameter, the step down surface being relative to the top surface that extends from the step down surface to an outer diameter of the annular body, the step down surface being an inner annular surface of the carrier ring;

wherein when the carrier ring is seated on the carrier ring supports, then the carrier ring surrounds the central top surface, and the step down surface of the carrier ring is positioned at a process level that is at a second vertical separation from the support level over the top surface of the pedestal;

wherein the first vertical separation defines a lower gap between the substantially planar region of the bottom surface of the carrier ring and the annular surface, the lower gap being less than about 0.15 mm, and the second vertical separation defines an upper gap between the step down surface of the carrier ring, when the carrier ring is seated on the carrier ring supports, and a bottom surface of the wafer when the wafer is seated on the plurality of wafer supports on the pedestal, the upper gap being maintained at less than about 0.15 mm when the wafer is seated on the wafer supports during the deposition processing;

wherein an edge of the wafer is configured to overhang over the top surface diameter so that the edge of the wafer overhangs and resides over the step down surface of the carrier ring when the wafer is present in the process chamber and supported on the wafer supports;

wherein the lower gap and the upper gap limit access by process gasses to a backside of the wafer during a deposition process, the lower gap and upper gap limiting deposition on the backside of the wafer at an edge region of the wafer to less than about 20% of deposition on a front side of the wafer at the edge region, the edge region being defined at approximately 3 mm from the edge of the wafer;

wherein the carrier ring is configured to support the wafer during transport of the wafer to or from the pedestal;

wherein the carrier ring includes a plurality of carrier ring wafer supports defined on the step down surface of the carrier ring, the step down surface being an inner annular surface of the carrier ring, the carrier ring wafer supports being configured to engage the wafer when the wafer is supported by the carrier ring during transport, the carrier ring wafer supports protruding above the step down surface of the carrier ring by a height amount that is less than the second vertical separation.

13. The process chamber of claim 12,
wherein the lower gap is about 0.1 mm or less;
wherein the upper gap is about 0.1 mm or less.

14. The process chamber of claim 12, wherein at least one of the carrier ring supports is supported by a spacer that adjusts the height of the at least one of the carrier ring supports to the fixed height, to define the first vertical separation.

15. The process chamber of claim 12, wherein the at least three carrier ring supports are symmetrically positioned at the outer diameter of the annular surface.

16. The process chamber of claim 12, wherein the deposition process is an atomic layer deposition (ALD) process.

17. A process chamber for depositing a film on a wafer, comprising:
a pedestal configured to receive the wafer, the pedestal having,
a central top surface extending from a central axis of the pedestal to a top surface diameter, the central top surface having a plurality of wafer supports defined thereon, the wafer supports configured to support the wafer during deposition processing at a support level above the central top surface,
an annular surface extending from the top surface diameter to an outer diameter of the annular surface, the annular surface being at a step down from the central top surface,
at least three separate carrier ring supports positioned at the outer diameter of the annular surface, the carrier ring supports extending radially inward of the outer diameter of the annular surface, the carrier ring supports being secured to the pedestal at a fixed height;
a carrier ring having an annular body with a bottom surface and a top surface, the bottom surface of the annular body of the carrier ring configured to be supported by the carrier ring supports during the deposition processing such that a substantially planar region of the bottom surface of the annular body is at a first vertical separation above the annular surface that is predetermined by the fixed height of the carrier ring supports, the carrier ring having an inner diameter and a step down surface is defined proximate to and surrounding the inner diameter, the step down surface being relative to the top surface that extends from the step down surface to an outer diameter of the annular body, the step down surface being an inner annular surface of the carrier ring;

wherein when the carrier ring is seated on the carrier ring supports, then the carrier ring surrounds the central top surface, and the step down surface of the carrier ring is positioned at a process level that is at a second vertical separation from the support level over the top surface of the pedestal;

wherein the first vertical separation defines a lower gap between the substantially planar region of the bottom surface of the carrier ring and the annular surface, the lower gap being about 0.1 mm or less, and the second vertical separation defines an upper gap between the step down surface of the carrier ring, when the carrier ring is seated on the carrier ring supports, and a bottom surface of the wafer when the wafer is seated on the plurality of wafer supports on the pedestal, the upper gap being maintained at about 0.1 mm or less when the wafer is seated on the wafer supports during the deposition processing;

wherein an edge of the wafer is configured to overhang over the top surface diameter so that the edge of the wafer overhangs and resides over the step down surface of the carrier ring when the wafer is present in the process chamber and supported on the wafer supports;

wherein the lower gap and the upper gap limit access by process gases to a backside of the wafer during a deposition process, the lower gap and upper gap limiting deposition by the deposition process on the backside of the wafer at an edge region of the wafer to less than about 20% of deposition on a front side of the wafer at the edge region, the edge region being defined at approximately 3 mm from the edge of the wafer;

wherein the carrier ring includes a plurality of carrier ring wafer supports defined on the step down surface of the carrier ring, the step down surface being an inner annular surface of the carrier ring, the carrier ring wafer supports being configured to engage the wafer when the wafer is supported by the carrier ring during transport, the carrier ring wafer supports protruding above the step down surface of the carrier ring by a height amount that is less than the second vertical separation.

18. The process chamber of claim 17, wherein the deposition process is an atomic layer deposition (ALD) process.

* * * * *